Figure 1:
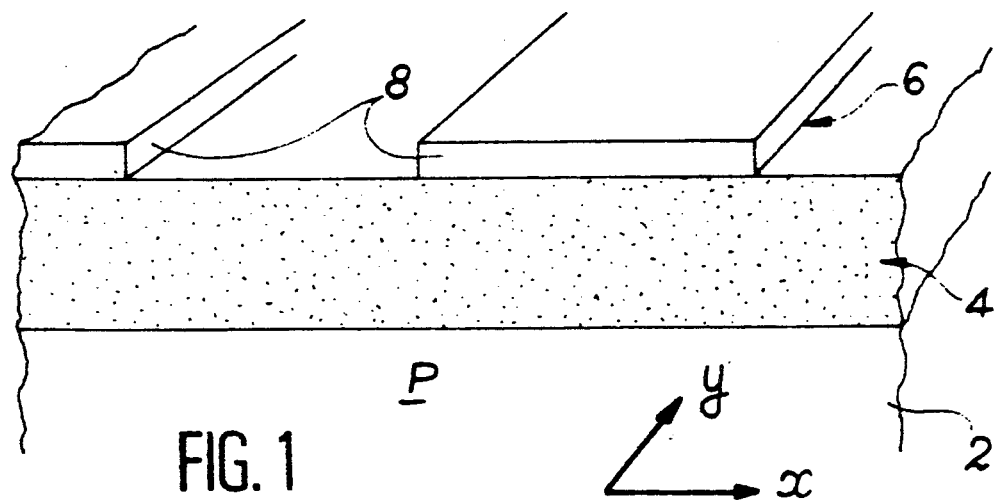

United States Patent [19]

Jeuch

[11] Patent Number: 5,138,573
[45] Date of Patent: Aug. 11, 1992

[54] NON-VOLATILE STORAGE CELL

[75] Inventor: Pierre Jeuch, Seyssins, France

[73] Assignee: Commissariat a l'Energie Atomique, France

[21] Appl. No.: 203,266

[22] Filed: Jun. 7, 1988

[30] Foreign Application Priority Data

Jun. 12, 1987 [FR] France .................. 87 08214

[51] Int. Cl.$^5$ .................. G11C 7/00; G11C 11/40
[52] U.S. Cl. .................. 365/182; 365/189.01; 365/185; 357/23.5
[58] Field of Search .......... 365/185, 174, 182, 189.01; 357/23.5

[56] References Cited

U.S. PATENT DOCUMENTS

| 4,661,833 | 4/1987 | Mizutani | 357/23.5 |
| 4,734,887 | 3/1988 | Sugatani | 365/185 |
| 4,803,529 | 2/1989 | Masuoka | 365/185 X |

Primary Examiner—James W. Moffitt
Assistant Examiner—Alyssa H. Bowler

[57] ABSTRACT

A non-volatile storage cell has (a) storage points which are insulated from one another and each having a stack of gates formed, in order, by a first insulant in contact with the substrate, a floating gate, a second insulant and a control gate, a source and a drain formed in substrate on either side of the stack and a channel, whose length is oriented in a direction (x) and (b) conductor lines serving to apply electric signals to the stacks of gates and the drains, the second insulant having, in a plane perpendicular to the surface of the substrate and containing the first direction (x), the shape of an inverted U within which is located the entire floating gate, the control gate also being shaped like an inverted U, without projection and within which is located the entire second insulant.

8 Claims, 7 Drawing Sheets

NON-VOLATILE STORAGE CELL

DESCRIPTION

The present invention relates to a floating gate, integrated, non-volatile storage cell, as well as to its production process. More specifically, the invention relates to EPROM (Erasable Programmable Read Only Memory) and EEPROM (Electrically Erasable Programmable Read Only Memory) cells of the flash type. It more particularly applies to the field of producing integrated MOS or CMOS memory or storage circuits.

An integrated EPROM or $E_2PROM$ memory is an integrated circuit having an actual memory part, called the storage cell, which is formed from several storage or memory points electrically interconnected and peripheral circuits used for controlling the storage points. The invention only relates to the actual memory or storage part and to its production.

The most modern floating gate EPROM cells permit the storage of $10^6$ bits, which today have surfaces of 20 to 25 $\mu m^2$ in a 1.2 $\mu m$ technology, i.e. in which the smallest strips and spaces are 1.2 $\mu m$. Therefore the surface of a memory is approximately 14 to 17 times that of the elementary lithographic square ($1200 \times 1200$ $nm^2$).

To an ever increasing extent, efforts are being made to reduce the dimensions of integrated circuits and in particular EPROMS with a view to increasing their integration density. Unfortunately in existing EPROMS, two factors considerably limit the reduction in the dimensions of the storage cell.

The first factor is the projection of the floating gate above the field oxide or lateral insulations. This projection is necessary as a result of the imprecision of superimpositions of the different layers constituting the storage points and the lithographic masks necessary for etching the different layers.

The second factor is the need to provide insulating guards around the contact holes of the bit lines, i.e. around the contact holes of the storage point drains, as well as around the contact holes of the supply lines, i.e. the contact holes of the sources of the storage points.

The reduction in the lithographic dimensions is not generally accompanied by a proportional improvement to the superimposing accuracy of the different lithographic masking levels, i.e. the aforementioned limiting factors become increasingly more disadvantageous for increasing the integration density of EPROMS.

Auto-alignment or auto-positioning processes that prevent the floating gate from projecting over the field oxide and/or provide the insulating guards around the contact holes become necessary for the future generation of EPROMS.

Apart from the integration density problem, the presently known EPROMS require, during the programming corresponding to writing, the application of high voltages to the control gate of the storage points of approximately 12 volts, in order to inject hot electrons, produced close to the drain, into the floating gate. The use of such high programming voltages is disadvantageous to the design of the peripheral circuits used for controlling the storage cell.

All these disadvantages also exist in EPROMS, which are only special EPROM forms. This can be clearly gathered from the article IEDM 86 by S. K. Lai et al "Comparison and Trends in Today's Dominant $E^2$ Technologies", pp. 580-583 and the article IEDM 85 by S. Mukherjee et al "A Single Transistor EEPROM cell and its Implementation in a 512K CMOS EEPROM", pp. 616-619.

The present invention relates to a non-volatile storage cell, such as an EPROM or EEPROM cell of the flash type and to its production process making it possible to obviate the aforementioned disadvantages. In particular, the storage cell according to the invention has an integral auto-alignment of all the constituent parts of its storage points leading to a memory surface only representing 4 to 5 times the minimum lithographic surface. Moreover, the storage cell according to the invention is not limited to micron technology and can be realized by submicron technology.

In addition, it has improved electrical performance characteristics. Thus, the cell access time during programming is reduced and the writing voltage is also reduced. It is possible to envisage using the same voltage for writing and reading and which is about 5 v.

More specifically, the present invention relates to an integrated non-volatile storage cell on a semiconductor substrate having (a) a matrix of storage points which are electrically and laterally insulated from one another, each storage point incorporating a stack of gates formed by a first insulant in contact with the substrate, a floating gate and a control gate separated from one another by a second insulant, the floating gate having a face in contact with the first insulant, a source and a drain formed in the substrate on either side of the stack of gates and a channel located in the substrate beneath said stack and whose length is oriented in accordance with a first direction passing from the source to the drain and (b) conductor lines for applying electric signals to the stacks of gates and to the drains, characterized in that the second insulant has, in a plane perpendicular to the surface of the substrate and containing the first direction, the shape of an inverted U within which is entirely located the floating gate and in that the control gate is also shaped like an inverted U, without projection, and within the same is entirely located the second insulant.

The particular shape of the floating gate and the control gate of the storage points makes it possible to increase the coupling surface between these two gates to at least 4 times the surface of the floating gate, thus improving the electrical performance characteristics of the storage cell.

Advantageously, the floating gate has a height at least twice greater than its width in the sense of increasing the coupling of the gates. Preferably, the width of the floating gate is less than 0.5 $\mu m$, which greatly contributes to reducing the dimensions of the storage cell.

In order to further improve the electrical performance characteristics of the cell by reducing the voltage necessary for writing in a storage point, use is preferably made of a first insulating material having a thickness less than that of the second insulant. Thus, the injection of hot electrons into the floating gate becomes more effective the thinner the floating gate insulant.

Moreover, the deterioration of the storage points by hot electrons injected from the side of the drain into the floating gate of the storage points is reduced as a result of a larger inter-gate insulant. In the case of a floating gate with a width less than 0.5 $\mu m$ and consequently storage points with channels less than 0.5 $\mu m$, it can be envisaged producing a slightly doped drain structure with a view to reducing the effects of this deterioration.

Advantageously, the conductor lines for controlling the stacks of gates and corresponding to the word lines are constituted by strips parallel to the direction of the channels of the storage points and the conductor lines for controlling the drains and corresponding to the lines of bits are perpendicular to the direction of the channels of the storage points. This makes it possible to avoid the use of an insulating layer in which are defined the electric contact holes for the sources and the drains of the storage points and consequently obviates the need for insulating guards around said contact holes, thus significantly reducing the dimensions of said storage cell.

Preferably, the control lines for the drains and those for supplying the sources are made from metals such as Al, W, Mo, Ta or a silicide of a refractory metal, such as $TiSi_2$, $TaSi_2$, $MoSi_2$, $WSi_2$, PtSi.

When the bit and/or supply lines are made from metal, it is necessary to provide an anti-diffusion barrier layer between the control conductor lines and the semiconductor substrate, in order to prevent diffusion of the metal of said conductor lines into the substrate. This anti-diffusion layer can be of TiN, or TiW.

Advantageously, the conductor lines for controlling the stacks of gates are made from metal and in particular aluminium or tungsten.

The invention also relates to a process for the production of a non-volatile storage cell integrated on to a semiconductor substrate having (a) a matrix of storage points electrically insulated from one another by lateral insulations, each storage point having a floating gate and a control gate in stacked form and which are insulated from one another, a source and a drain located on either side of the stack of gates and a channel located beneath said stack, whose width is oriented in accordance with a first direction from the source to the drain and (b) conductor lines for applying electric signals to the stacks of gates and to the drains of the storage points, characterized in that the floating gates are produced by isotropically depositing on steps of a first material a layer of a second conductor material which can be selectively etched with respect to the first material, followed by anisotropically etching the layer of second material until the steps are exposed.

The production of the floating gate according to the invention makes it possible to very accurately produce a floating gate with a submicron width and in particular less than 0.5 μm, as well as a floating gate having a height which significantly exceeds its width. In the prior art, the height of the floating gate is generally well below its width.

Advantageously, the stacks of gates are formed by performing the following successive stages:

(a) producing steps of a first material on a semiconductor substrate of a first conductivity type, said steps being in the form of small strips oriented perpendicular to the first direction, (b) deposition of a third insulating material on the substrate between the steps, (c) isotropic deposition on the steps and the third material of layer of a second material, (d) anisotropic etching of the second material layer in order to obtain second conductive strips parallel to the first strips, (e) elimination of the steps and regions of the third material not covered by the second material, (f) deposition of a fourth insulating material on the regions of the substrate exposed during stage (e) and on the second conductive strips, (g) deposition of a fifth conductive material on the fourth material having overhanging parts facing the second conductive strips, (h) masking with the aid of a sixth material of overhanging fifth material parts, (i) elimination of the regions of the fifth and fourth materials not covered by the sixth material, (j) producing a lithography mask in the form of third strips oriented perpendicular to the second strips and defining the length of the stacks, (k) elimination of the regions of the fifth, fourth, second and third materials which are not masked, thus producing the stack of gates, and (l) elimination of the mask.

The fact that the control gate covers the floating gate on three sides makes it possible to ensure a maximum coupling between these two gates.

According to the invention, the process for producing a double gate, non-volatile storage cell comprises the following successive stages:

(a') producing steps of a first material on the semiconductor substrate, (b') deposition of a third insulating material on the substrate between the steps, (c') isotropic deposition on the steps and the third material of a second material layer, (d') anisotropic etching of the second material layer to obtain second conductive strips, (e') elimination of the steps and regions of the third material not covered by the second material, (f') deposition of a fourth material, (g') deposition of a fifth conductive material on the fourth material, (h') masking with the aid of a sixth material of overhanging fifth material parts, (i') elimination of regions of the fifth material not covered by the sixth material, (j') implanting ions of a second conductivity type in the regions of the substrate adjacent to the overhanging parts to form sources and drains, (k') producing spacers of a seventh insulating material on the edges of the overhanging fifth material parts and elimination of the fourth material regions not covered by the sixth material, (l') producing first conductor lines on the sources and drains oriented parallel to the second conductive strips, (m') covering the first conductor lines with an eighth insulating material, (n') producing the lithography mask in the form of third strips, (o') elimination of regions of the fifth, fourth, second and third materials which are not masked and in this way producing the stack of gates, (p') elimination of the mask, (q') filling the inter-stack spaces obtained in stage (o') with a ninth material and (r') producing second conductor lines on the stacks oriented perpendicular to the first conductor lines.

The first material, which can be a conductive or insulating material, must differ from the third material, in order that the latter can be etched independently of the first material and vice versa.

Apart from the advantages given hereinbefore, the process according to the invention offers significant simplifications compared with the known processes by reducing the number of lithographic masks to three, namely a mask for defining the location of the insulating steps, a mask for defining the width of the stacks of gates and a mask for defining the dimensions of the conductor lines for controlling the stacks of gates. Moreover, these masks have a simple configuration (parallel strips) and are consequently easy to produce.

Figure 8:
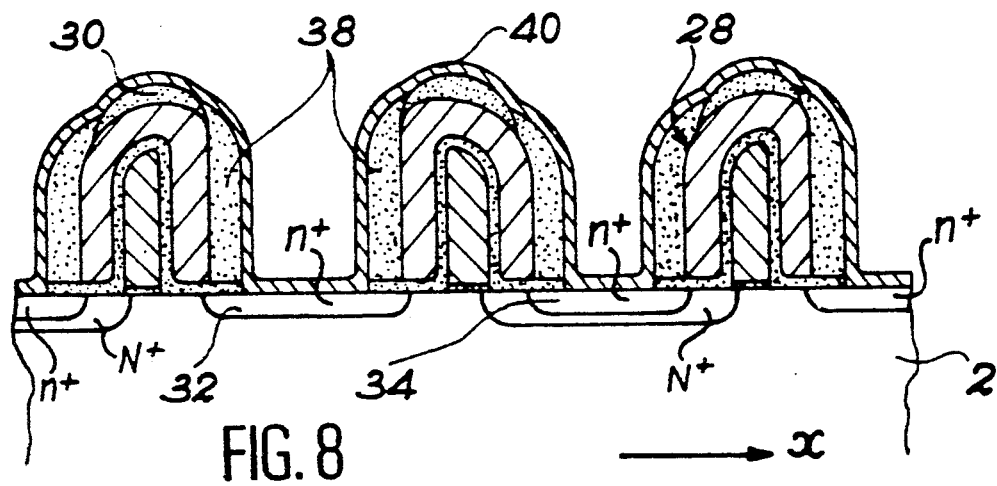
Figure 9:
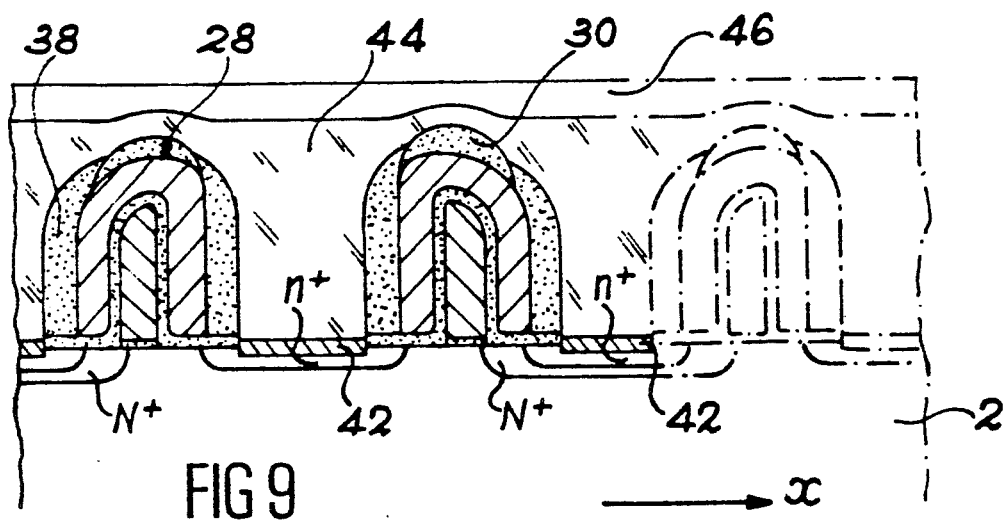
Figure 10A:
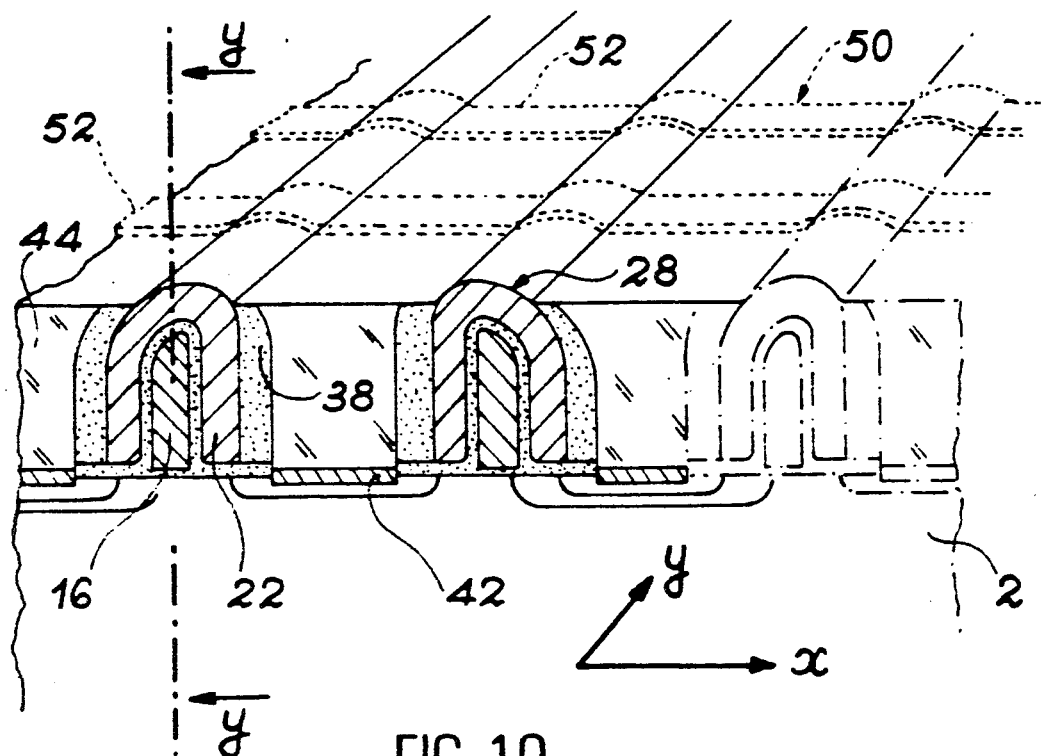
Figure 10B:
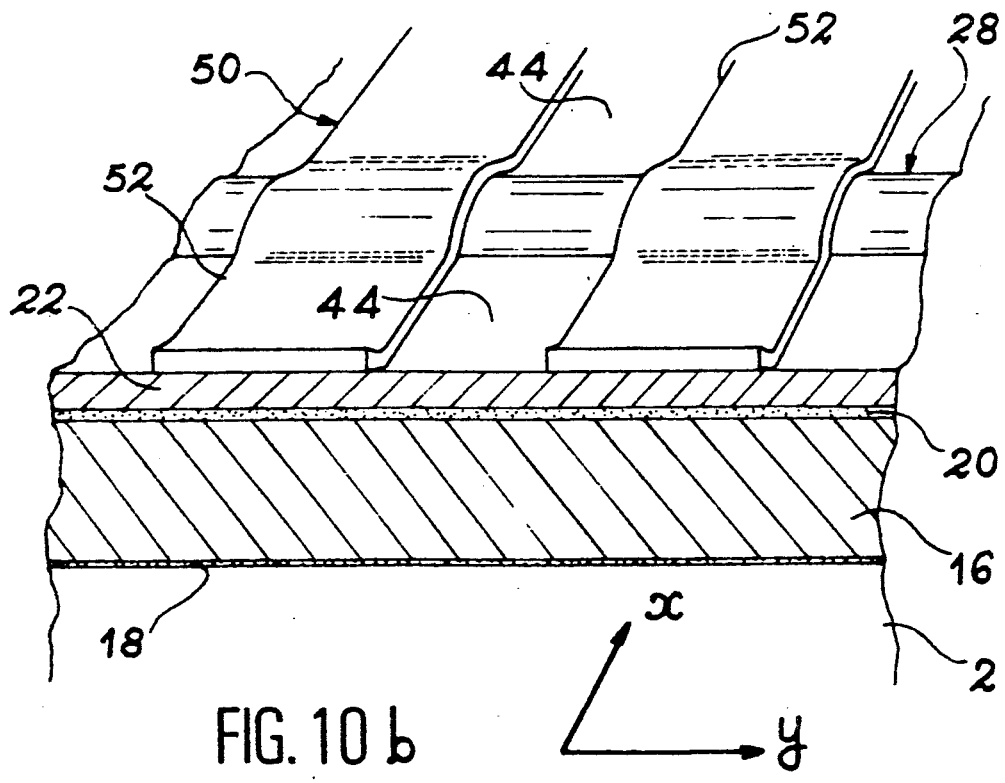
Figure 11:
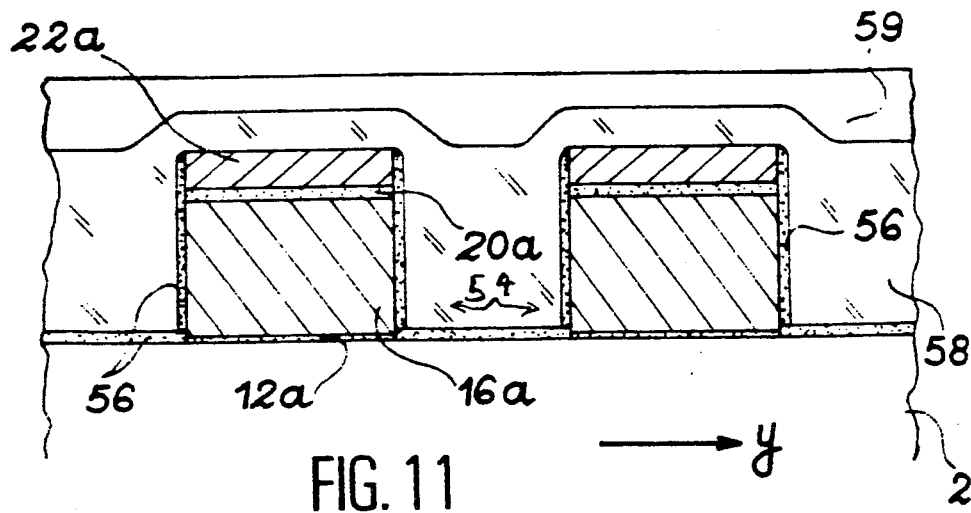
Figure 12:
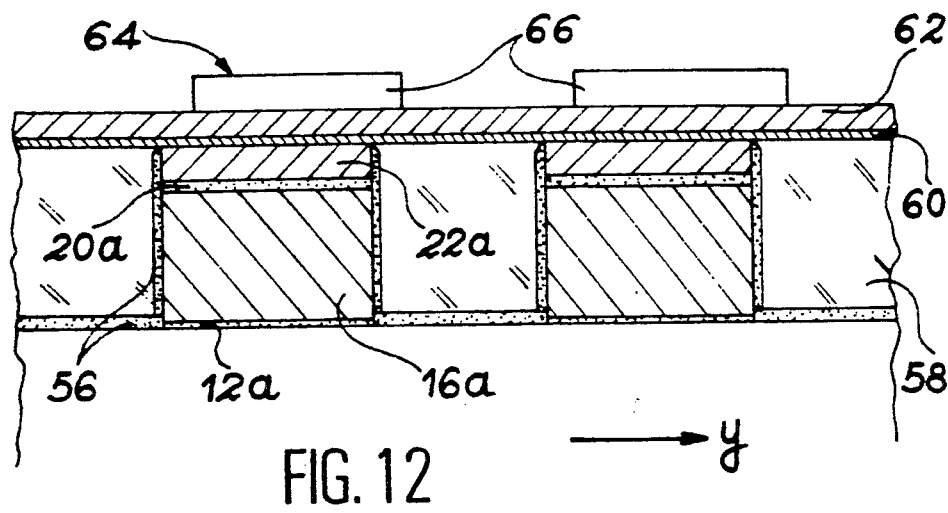
Figure 13:
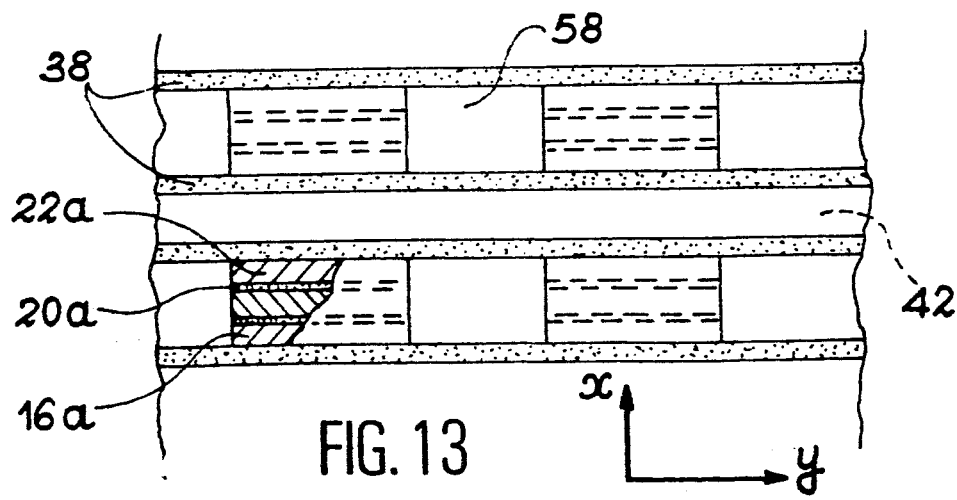
Figure 14:
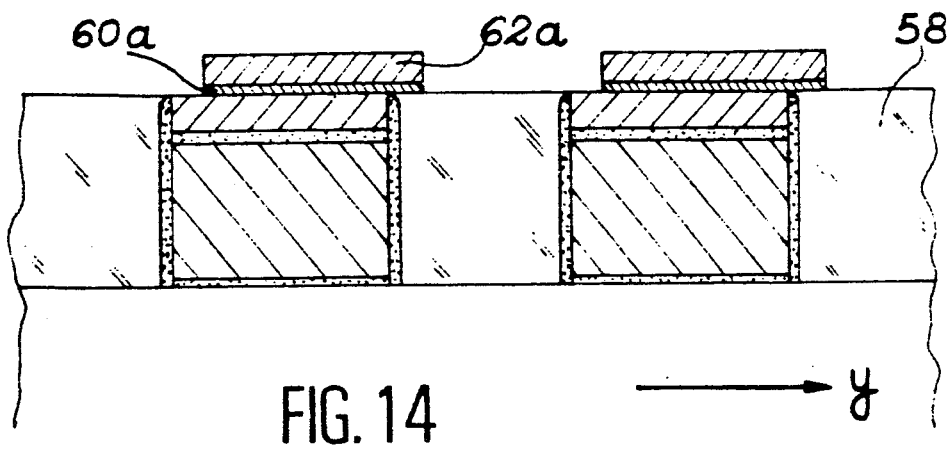

Other features and advantages of the invention can be gathered from the following description of non-limitative embodiments and with reference to the attached drawings, wherein show:

FIGS. 1 to 14 Diagrammatically the different stages of the process for producing EPROM storage points according to the invention, FIGS. 2 to 9 being longitudinal sections, FIGS. 11, 12 and 14 cross sections, FIGS. 1, 10a and 10b perspective views and FIG. 13 a plan view.

Figure 15:
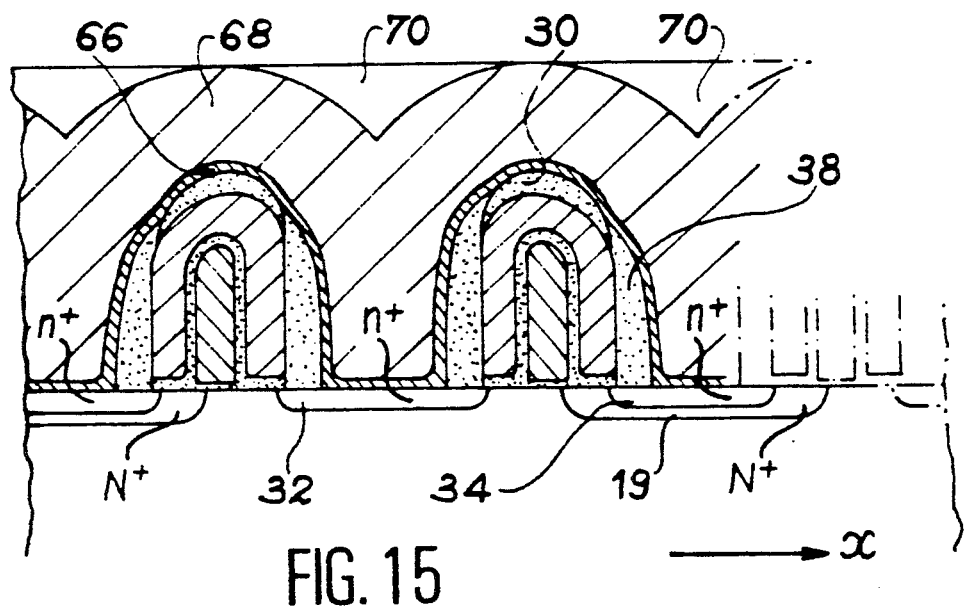
Figure 16:
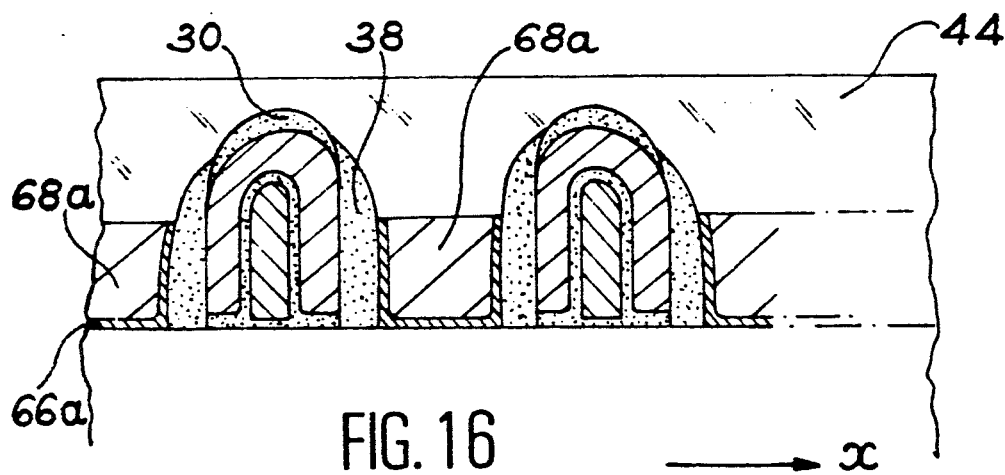

FIGS. 15 and 16 A variant of the process according to the invention.

Figure 17:
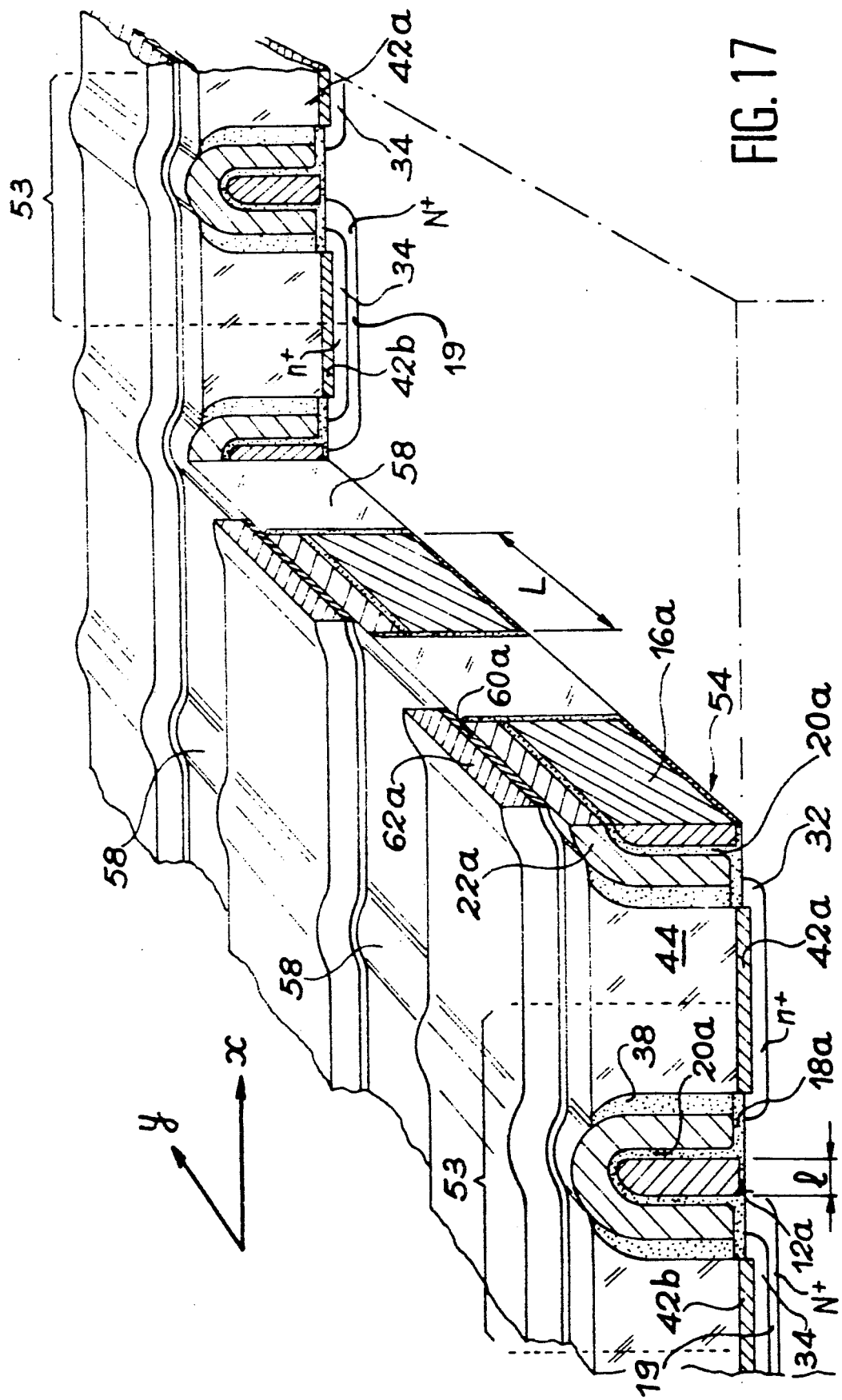

FIG. 17 Diagrammatically and in perspective an EPROM cell according to the invention.

As shown in FIG. 1, the first stage of the process consists of forming on a p-type monocrystalline silicon, orientation 100 semiconductor substrate 2 a silicon dioxide ($SiO_2$) layer 4 with a thickness of 1 $\mu$m. Layer 4 is obtained by chemical vapor phase deposition (CPVD).

By photolithography is then produced a first resin mask for defining the location of the different storage points and in particular the location of the floating gates. This mask 6 is in the form of parallel rectilinear strips 8 which extend in a direction y perpendicular to the sectional plane of FIG. 1. Direction y corresponds to the direction of the lines of words of the storage cell. These strips 8 have a constant width and are equidistant. They are e.g. spaced by 2.5 $\mu$m, have a width of 2.5 $\mu$m and a length of 2 mm.

Figure 2:
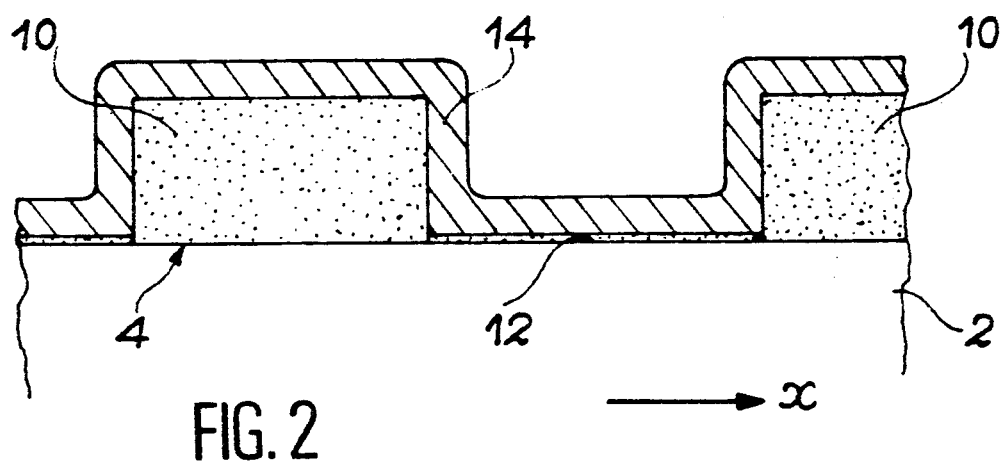

As shown in FIG. 2, this is followed by the elimination of the regions of layer 4 not covered by the resin strips 8, in order to form silicon dioxide strips 10 which are parallel to one another and to direction y. This elimination is carried out by reactive ionic etching using a $CHF_3$ plasma for a silicon dioxide layer 4. Etching is continued until the unmasked silicon regions 2 are exposed.

After eliminating the resin mask 6 by an oxygen plasma, a thermal oxidation is carried out at 900° C. for 10 minutes of the exposed substrate regions in order to form between the steps an approximately 15 nm silicon dioxide layer 12. In said oxide 12 will be subsequently defined the gate oxide of the floating gates of the storage points of the storage cell.

On the complete structure is then isotropically deposited a polycrystalline silicon layer 14 doped with phosphorus by $POCl_3$ diffusion. This layer 14 deposited by chemical vapor deposition (CVD or LPCVD) has a thickness of 250 nm. In said layer 14 will be subsequently formed the floating gates of the storage points.

Figure 3:
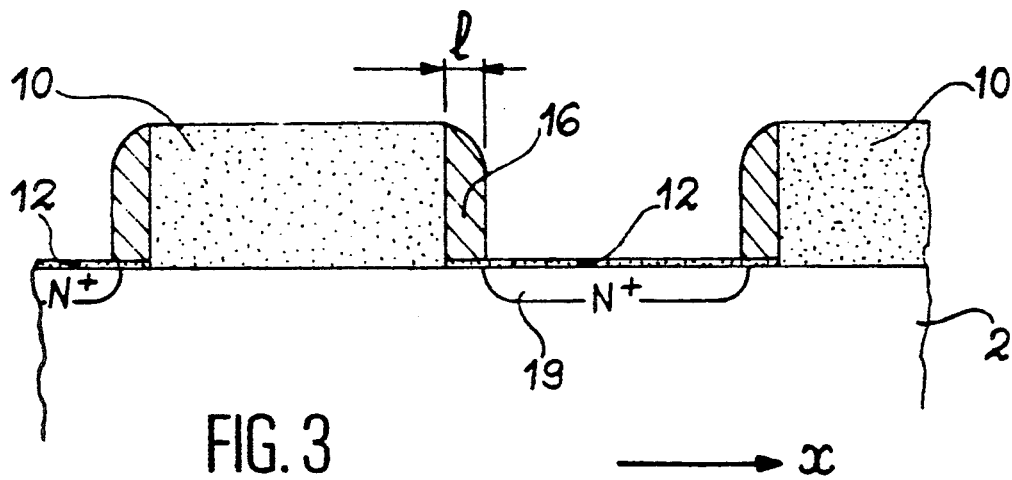

This is followed by mask-free etching of the silicon layer 14 using a $SF_6$ plasma until the insulating strips 10 are exposed over a thickness of approximately 250 nm, so that polycrystalline silicon is only left on the edges of the strips 10, in the manner shown in FIG. 3. This leads to the formation of conductive strips 16 parallel to direction y, whereof the width L is equal to the thickness of the silicon layer 14 and in which will be defined the floating gates of the storage cells. The length of the channel of each storage cell, defined beneath the floating gate of said cell, is equal to L.

This is followed by a doping of the substrate with a reverse conductivity to that of the substrate. This doping can be carried out by implanting arsenic ions for a type p substrate 2 with an energy of 100 keV and at a dose of $5 \cdot 10^{15}$ atm/$cm^2$. It is thus possible to obtain between the conductive strips 16 type N+ regions 19, which will partly constitute the drains (in writing) of the storage points.

Figure 4:
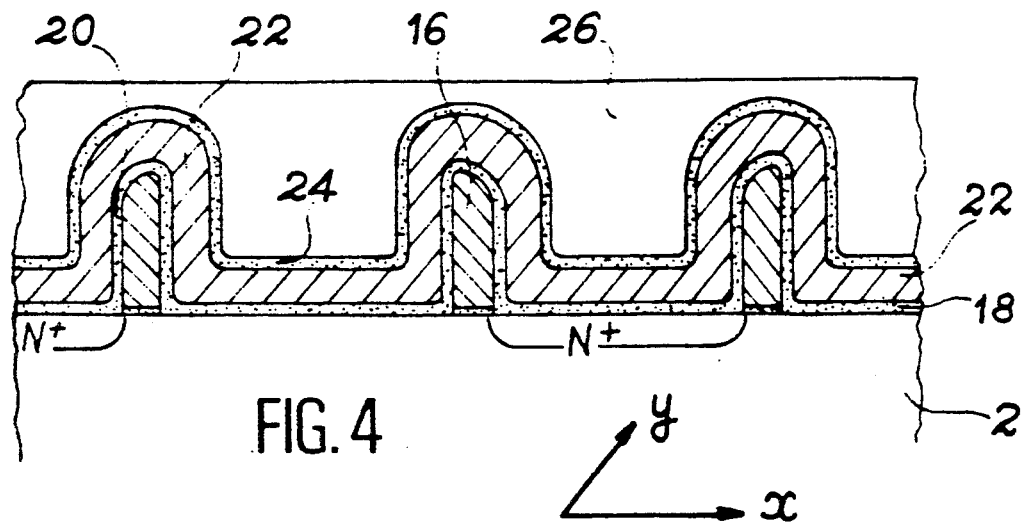

The $SiO_2$ strips 10 are then eliminated by carrying out a chemical etching over a thickness of 1 $\mu$m using a hydrofluoric acid solution. This chemical etching also makes it possible to eliminate the silicon oxide regions 12 exposed during the formation of the spacers 16. The structure obtained is shown in FIG. 4.

This is followed by a thermal oxidation of the silicon of the conductive strips 16 and the regions of the substrate which have been exposed and located between the spacers 16, in order to simultaneously form the gate oxide 18 of the control gates of the storage points of the cell and the inter-gate oxide 20 of the storage points. These silicon oxides 18 and 20 are produced by thermal oxidation at 900° C. for 10 minutes in order to obtain an oxide 25 nm thick.

On oxides 18 and 20 is then formed another polycrystalline silicon layer 22, which is phosphorus-doped by $POCl_3$ diffusion and in which will subsequently be produced the control gates of the storage points. Layer 22 deposited by CVD or LPCVD has a thickness of 250 nm.

On the silicon layer 22 is then deposited an approximately 80 nm thick silicon nitride layer 24 using low pressure chemical vapor phase deposition (LPCVD).

On the nitride layer 24 is deposited a photosensitive resin layer 26, like that conventionally used in photolithography and over a thickness of 1800 nm. Optionally a heat treatment is carried out to this resin layer, e.g. baking at approximately 200° C. for 15 minutes to obtain a good spreading of the resin.

Figure 5:
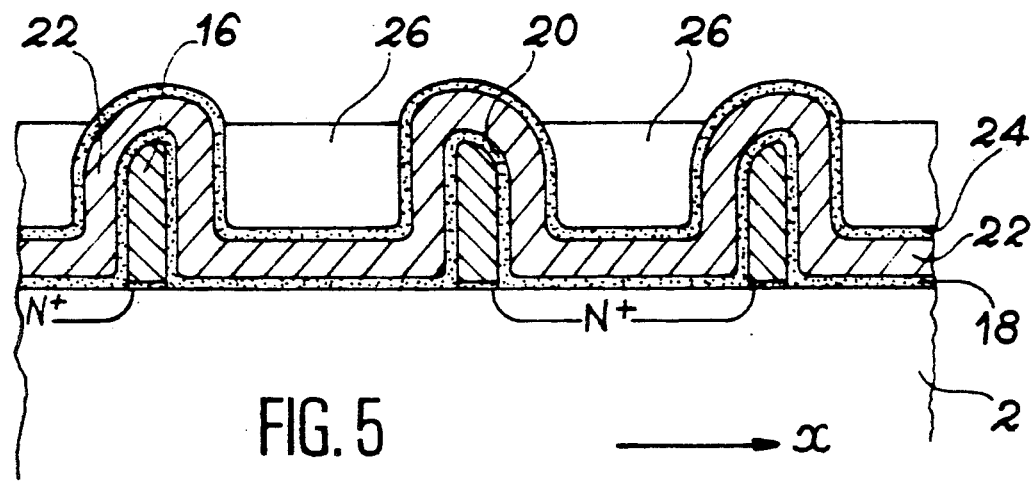

This is followed by anisotropic etching using $O_2$ plasma of said resin layer, so that the resin is only retained in the hollowed out parts of the relief of the structure. The resulting structure is shown in FIG. 5.

The regions of the nitride layer 24 not covered with resin 26 are then eliminated by reactive ionic anisotropic etching using as the etching agent $CHF_3$. Etching of the nitride layer 24 is carried out so as to only retain the nitride between the parallel strips 28 of the stacks of materials and on the edges of said strips.

Figure 6:
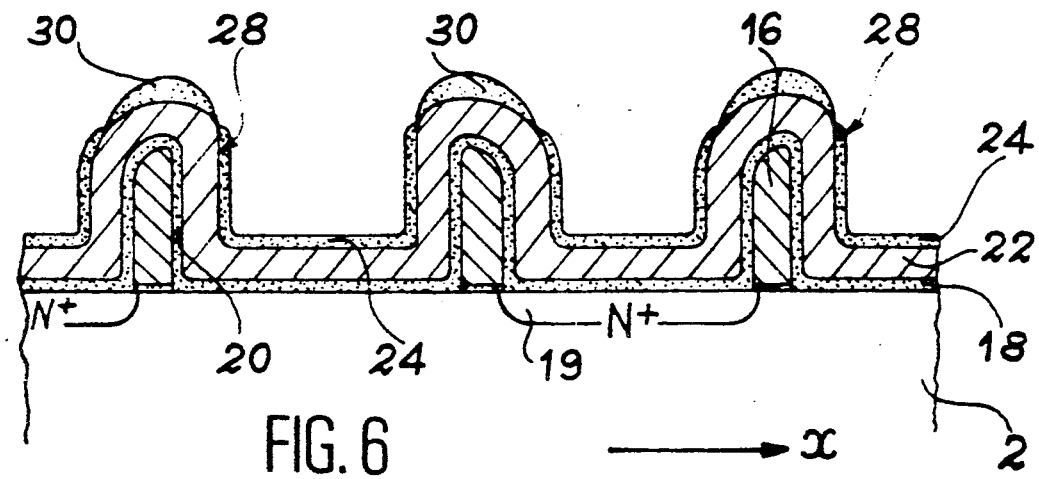
Figure 7:
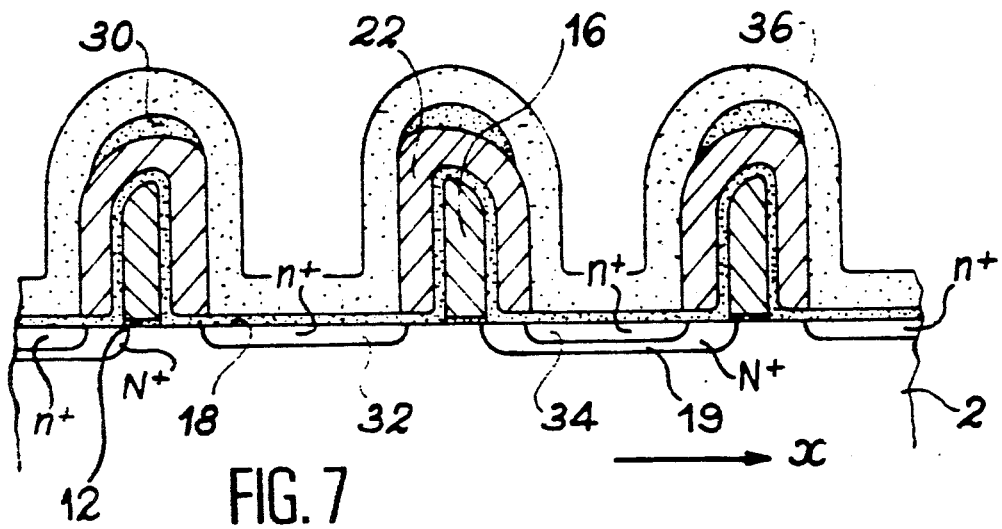

Following the elimination of the remainder of the resin 26 e.g. using an oxygen plasma, thermal oxidation of the polycrystalline silicon 22 exposed over a thickness of 60 nm is carried out at a temperature of 900° C. for 30 minutes, so that $SiO_2$ studs 30 are formed above the overhanging parts 28 and as shown in FIG. 6. This is followed by the elimination of the remainder of the nitride layer 24 by chemical etching in an $H_3PO_4$ solution (FIG. 7).

This is followed by mask-free etching of the polycrystalline silicon layer 22, in order to eliminate the silicon present between the strips 28 and in order to only retain polycrystalline silicon beneath the local oxidation 30. This is carried out by reactive ionic etching using $SF_6$ as the etching agent.

The source and drain of the storage points are then formed by using a doping of substrate 2 having a conductivity which is the reverse of the latter. For a type p silicon substrate, said doping can be carried out by implanting arsenic ions with a dose of $5 \cdot 10^{15}$ atm/$cm^2$ with an energy of 100 keV. The implanted zones 32 serve as sources and zones 34 associated with zones 19 serve as drains during the writing of an information.

The preceding stages make it possible to obtain storage cells, whose source 32 is not covered by the control gate unlike the drain, which corresponds to the partial overlap of the channel of storage cells by their control gate. Such an arrangement makes it possible to avoid leakage currents.

This is followed by the isotropic deposition of a silicon dioxide layer 36 with a thickness of approximately 300 nm, e.g. using a low pressure chemical vapor phase deposition process. The resulting structure is shown in FIG. 7.

As shown in FIG. 8, this is followed by an etching of layer 36, in order to only retain insulating strips or spacers 38 on all the etched edges of the stacks of materials 28. These spacers 38 are obtained by reactive ionic anisotropic etching using $CHF_3$ as the etching agent.

These spacers 38 are 300 nm wide defined by the thickness of the isotropically deposited $SiO_2$ layer 36. This etching is of the mask-free type. It also makes it possible to eliminate the silicon dioxide 18 between two consecutive spacers 38.

This is followed by a heat treatment of the structure, e.g. at 850° C. for 30 minutes, in order to electrically activate the ions of the sources and drains implanted in the substrate.

This is followed by the deposition of a layer 40 on the complete structure of a metal able to form a silicide. This layer is in particular an approximately 30 nm thick titanium layer deposited by magnetron sputtering.

The complete structure is then annealed at a temperature of 600° C. for approximately 15 minutes and in a neutral gas atmosphere (e.g. $N_2$), which makes it possible to form a silicide 42 ($TiSi_2$), as shown in FIG. 9, by the reaction of the metal (titanium) with the silicon of the substrate 2 in contact with one another, between spacers 38, i.e. on sources 32 and drains 19, 34.

This is followed by the elimination of the parts of layer 40 not in contact with the silicon and consequently not formed from silicide. The selective elimination of the titanium with respect to the titanium silicide takes place chemically using a mixture of nitric acid and hydrofluoric acid. The conductor lines 42 obtained are used for carrying electric signals to be applied to the sources and drains, during the writing or reading of information into the storage cell.

An approximately 800 nm insulating layer 44 of phosphosilicate glass (PSG) or borophosphosilicate glass (BPSG) is then deposited by chemical vapor phase deposition. Layer 44 then undergoes a heat treatment to make it flow and to densify it, at a temperature of 850° C. for 30 minutes. Insulating layer 44 is then covered with a photosensitive "planarization" resin layer 46 of approximately 800 nm. A heat treatment, e.g. heating to a temperature of 200° C. for 30 minutes, makes it possible to adequately spread the resin layer.

This is followed by a simultaneous etching of the resin layer 46, the glass 44 and the local oxide 30 at identical etching speeds for the resin, glass and oxide until the polycrystalline silicon 22 of the top of the strips 28 is exposed. The structure is as shown in FIGS. 10a and 10b.

This etching is carried out anisotropically by reactive ionic etching using fluorine-containing agents ($CHF_3$ or $CF_4$) and oxygen, the fluorine compounds being used for etching the oxide and glass and the oxygen for etching the resin.

As shown in FIG. 10a, the following stage of the process consists of forming a new photosensitive resin lithographic mask 50 defining the length of the stacks of gates and therefore the width of the channel. Mask 50 is thus in the form of strips 52 parallel to direction x. These strips 52 are 1.2 μm wide and have a 1.2 μm spacing from one another.

With the aid of said mask and as shown in FIG. 11, elimination takes place of the regions of the strips 28 of successive layers 22, 20, 14, 18 not covered by the resin strips 52 of mask 50. This elimination takes place by successive reactive ionic anisotropic etching processes using as the etching agent $CHF_3$ for the $SiO_2$ layers 20, 18 and 12 and $SF_6$ for the silicon layers 22 and 14. Etching takes place until the substrate is exposed, the structure being shown in FIG. 11. The stacks 54 of floating gates 16a and control gates 22a are then completed. The gate and inter-gate insulants respectively carry the references 12a and 20a.

Following the elimination of the resin mask 50 by an oxygen plasma, a thermal oxidation 56 takes place of the exposed regions of substrate 2 and the etched edges of stacks 54 with a thickness of 50 nm, at a temperature of 900° C. for 20 minutes.

This is followed by the deposition of an insulating e.g. borophosphosilicate glass layer 58 over a thickness of 800 nm using chemical vapor phase deposition. Layer 58 then undergoes a heat treatment to make it flow and densify it, e.g. at 850° C. for 30 minutes.

Layer 58 is then covered with a 800 nm thick "planarization" photosensitive resin layer 59. Heating at a temperature of 200° C. for 30 minutes makes it possible to adequately spread resin layer 59.

Simultaneous etching is then performed of resin layer 59 and the BPSG glass 58 until the silicon 22 of the gate stacks 54 is exposed. The structure obtained is shown in FIG. 12. This etching is carried out anisotropically using reactive ionic etching and fluorine-containing agents ($CHF_3$ or $CF_4$) for etching the glass and oxygen for etching the resin. The structure obtained after etching is shown in the plan view of FIG. 13.

The following stage of the process (FIG. 12) consists of depositing two superimposed conductive layers 60, 62 respectively of TiW and Al and 100 nm and 600 nm, which are deposited by magnetron sputtering.

This is followed by the formation of a third photosensitive resin mask 64 identical to mask 50 and also having strips 66, parallel to direction x, with a width of 1.2 μm and separated from one another by 1.2 μm. This mask makes it possible to define the dimensions of the lines of words, i.e. those of the control conductor lines of the gate stacks 54.

Using mask 64, layers 62 and 60 are then etched in order to eliminate the regions thereof not covered with resin. The structure obtained is shown in FIG. 14. This etching is carried out by reactive ionic anisotropic etching using as the etching agent $CCl_4$ for the aluminum layer 62 and $SF_6$ for the TiW layer 60. This gives the gate control conductor line 60a, 62a in the form of strips parallel to x.

The final stage of the process consists of eliminating mask 64 with an oxygen plasma.

The inventive process described hereinbefore makes it possible to obtain a quasi-planar structure. Moreover, this process only involves three masking levels 6, 50 and 64, each formed by parallel strips and consequently having a relatively simple construction.

FIGS. 15 and 16 show a variant of the process described hereinbefore consisting of replacing the silicide conductor lines 42 by two-layer titanium nitride and tungsten conductor lines.

After producing spacers 38 and the implantation annealing of the sources and drains 32 and 19, 34 of the storage points, a titanium nitride (TiN) layer 66 with a thickness of 100 nm is deposited, followed by an 800 nm thick tungsten layer 68 using magnetron sputtering. The TiN layer 66 serves as a diffusion barrier to prevent any reaction between the metal of layer 68 and the silicon during subsequent heat treatments.

This is followed by the deposition of an e.g. 1800 nm thick photosensitive resin layer 70, which undergoes a heat treatment at approximately 200° C. for 15 minutes, in order to adequately spread said layer. The resin layer 70 is etched, so as only to retain resin in the hollowed out parts of the relief of the structure, as shown in FIG. 15.

This is followed by an etching of layers 68 and 66 and simultaneously the elimination of resin 70. Etching is carried out anisotropically using reactive ionic etching and $SF_6$ for the TiN layer and the W layer. Etching is carried out over a height of approximately 500 nm beneath strips 28. The structure obtained is shown in FIG. 16 and the conductor lines obtained carry references 66a and 68a. As hereinbefore, this is followed by the deposition of glass layer 44.

A description will now be given of the EPROM cell obtained by the inventive process. The EPROM cell shown in FIG. 17 has, as in the prior art storage cells, a matrix or array of memory or storage points 53, each having a source 32 and a drain 19, 34 of the $n^+$ type produced in a p-type monocrystalline silicon substrate 26. Stacks 54 of gates are provided between the sources and the drains. The channels of the storage points passing from the source to the drain are oriented in a direction x.

These stacks 54, starting from substrate 2, are formed by a 15 nm thick, silicon dioxide gate insulant 12a, a phosphorus-doped, polycrystalline silicon floating gate 16a in contact with the insulant 12a, a 25 nm thick, $SiO_2$ inter-gate insulant 20a and a 250 nm thick, phosphorus-doped, polycrystalline silicon control gate 22a. These stacks typically have a height between 1000 and 1500 nm, as against 600 to 700 nm in the state of the art.

According to the invention, the floating gate 16a of each storage point has in a plane (that of FIGS. 1 to 9), perpendicular to the substrate surface and containing the direction x of the channels of the storage points, the shape of a stud with a width of approximately 250 nm, a length L of approximately 1.2 μm and a height of 1 μm. It is covered on three of its sides by the intergate insulant 22a, which then has the shape of an inverted U, in the plane perpendicular to the substrate surface and containing direction x.

This insulating material U is itself entirely located in the control gate 22a, which is also in the form of an inverted U in the plane perpendicular to the substrate surface and containing direction x. In order to electrically insulate the control gate 22a from the substrate, a gate insulant 18a is provided at the ends of the branches of the U, said insulant being of $SiO_2$ and having a thickness of 25 nm.

The U of control gate 22a has no extension in direction x, which contributes to increasing the memory integration density. Moreover, the control gate 22a partly covers the drain 19, 34 of the storage cell and consequently the channel beneath the floating gate 16a, which leads to the formation of a second channel adjacent to the first.

In order to electrically insulate from one another the storage points 55, lateral insulations 58 or 44 are provided. These insulations can be of phosphorus-doped silicon dioxide ($SiO_2$), phosphosilicate glass or borophosphosilicate glass. In addition, $SiO_2$ spacers 38 are provided on either side of stacks 54. These spacers 38 are in the form of strips and are oriented in direction y perpendicular to the channels of the storage points.

According to the invention, the floating gate 16a and the control gate 22a of the different storage points do not extend above the lateral insulations 38, 58, 44 and are auto-aligned or autopositioned relative to said insulations.

According to the invention, the interconnection of the control gates 22a, corresponding to the lines of words, is brought about by metallic conductive strips 60a, 62a, oriented parallel to the direction x of the storage points. These strips can be of a twin layer TiW-Al, the TiW being in contact with the control gates 22a.

Moreover, the connection of the drains 34 of the storage points, corresponding to the lines of bits, is brought about with the aid of conductive strips 42a parallel to direction y, which is perpendicular to the metallic lines for connecting the gates and therefore to the channels of the storage points.

In the same way, the connection of the sources 32 of the storage points, corresponding to the supply lines of said storage points, is constituted by conductive strips 42b parallel to the conductive strips 42a for connecting the drains.

The bit and supply lines are made from one or more metal layers (Al, W, Ta, Mo, etc.) or from a refractory metal silicide such as $TiSi_2$, $TaSi_2$, $MoSi_2$, $WSi_2$, $PtSi$.

In order to read the content of a particular storage point, it is necessary to polarize the bit lines 42a by applying thereto a voltage of 5 v and earthing the corresponding supply line 42b, the other supply lines not being polarized. This is necessary in view of the fact that two adjacent storage points, which share the same bit line 42a, are activated by the same word line 60a–62a. The voltage applied to the supply lines and to the word lines, both during writing and reading, is approximately 5 v. In writing, the functions of the sources and drains are the opposite to those during reading.

The above description has clearly only been given in an exemplified manner and any modification can be envisaged without passing beyond the scope of the invention. In particular, it is possible to modify the thickness of different layers, to replace the silicon dioxide insulating layers by silicon nitride layers and to replace the polycrystalline silicon conductive layers by other conductive metals, such as refractory metals or silicides.

In the same way, it is possible to replace all the reactive ionic etching operations by other wet or dry etching processes generally used in microelectronics. Furthermore, in the case of layers made from a material which is difficult to etch, such as copper or silver layers, it is possible to use ionic working processes.

The above description only refers to the production of an EPROM cell. In the case of a flash-type EEPROM cell, it is merely necessary to use a 10 nm instead of 15 nm gate oxide 12a. In such a cell, the writing and reading of an information take place as in an EPROM cell and erasing takes place by applying 5 or 10 v to the corresponding supply line 42b and −5 or 0 v to the corresponding word line.

The fact that the control gate of each storage cell partly covers the channel of said cell makes it possible to avoid or at least control leakage currents, which is particularly advantageous in the case of EPROM cells. This also makes it possible to obtain two adjacent cells or split gates and therefore to obtain an EPROM cell associated with a selection transistor, which makes it possible to avoid the disadvantages on negative threshold.

The importance of the selection transistor for each storage cell is stressed in the article by S. K. Lai et al "VLSI Electrically Erasable Programmable Read Only Memory", VLSI Handbook, 1985, pp. 167-168. The second function of the selection transistor, which is to prevent the erasing of unselected cells of the same column of the matrix of storage cells, is abandoned in flash-type EPROMS, because erasure takes place on all the cells of the same column.

Finally, the above description only relates to the production of the storage cell or the actual memory, whereas the peripheral and control circuits located in the same plane as the storage cell are produced in a conventional manner and do not form part of the present invention.

I claim:

1. An integrated non-volatile storage cell on a semiconductor substrate (2) having (a) a matrix of storage points (53) which are electrically and laterally insulated from one another, each storage point (53) incorporating a stack of gates (54) formed by a first insulant (12a) in contact with the substrate (2), a floating gate (16a) and a control gate (22a) separated from one another by a second insulant (20a), the floating gate having a face in contact with the first insulant and a height which is at least twice its width, a source (32) and a drain (19,34) formed in the substrate (2) on either side of the stack of gates (54) and a channel located in the substrate beneath said stack and whose length is oriented in accordance with a first direction (x) passing from a source to a drain and (b) conductor lines (60a, 62a, 42a, 66a, 68a) for applying electric signals to the stacks of gates (54) and to the drains, characterized in that the second insulant (20a) has, in a plane perpendicular to the surface of the substrate and containing the first direction (x), the shape of an inverted U within which is entirely located the floating gate (16a) and in that the control gate (22a) is also shaped like an inverted U, without lateral extensions in a direction parallel to said first direction (x), and within the same is entirely located the second insulant (20a).

2. The storage cell according to claim 1, characterized in that the width of the floating gate (16a) is less than 0.5 μm.

3. The storage cell according to claim 1, characterized in that the first insulant (12a) has a thickness less than that of the second insulant (20a).

4. The storage cell according to claim 1, characterized in that the conductor lines (60a, 62a) for controlling the stacks of gates (54) are constituted by strips parallel to the first direction and in that the conductor lines (42a, 66a, 68a) for controlling drains (19, 34) are perpendicular to the first direction.

5. The storage cell according to claim 1, characterized in that the control lines (42a, 66a, 68a) of drains (19, 34) are produced from a metal layer or a silicide layer.

6. The storage cell according to claim 5, characterized in that a layer (66a) serving as an anti-diffusion barrier for the drain control lines (68a) is provided for preventing metal diffusing into the semiconductor substrate (2).

7. The storage cell according to claim 1, characterized in that the conductor lines (60a, 62a) for controlling the stacks of gates (54) are made from a metal.

8. The storage cell according to claim 1, characterized in that the control gate (22a) partly covers the drain (19, 34) and therefore the channel, but not the source (32).

* * * * *